(12) United States Patent
Letts

(10) Patent No.: US 6,928,374 B2
(45) Date of Patent: Aug. 9, 2005

(54) METHODS FOR DISPLAYING JITTER AND OTHER ANOMALIES IN LONG ACQUISITION DATA RECORDS

(75) Inventor: Peter J. Letts, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 43 days.

(21) Appl. No.: 10/679,991

(22) Filed: Oct. 6, 2003

(65) Prior Publication Data

US 2004/0102910 A1 May 27, 2004

Related U.S. Application Data

(60) Provisional application No. 60/428,493, filed on Nov. 22, 2002.

(51) Int. Cl.$^7$ .............................................. G01R 13/02
(52) U.S. Cl. ............................ 702/67; 702/66; 702/69; 702/124
(58) Field of Search ........................ 702/66–68, 69–71, 702/57, 73, 74, 78, 79, 80, 124–126, 117, 118, 120, 122, 176, 178, 187, 189; 345/440.1; 324/76.12, 76.13

(56) References Cited

U.S. PATENT DOCUMENTS 6,137,283 A * 10/2000 Williams et al. .......... 324/76.12
6,728,648 B1 * 4/2004 Letts ............................ 702/71
6,778,931 B1 * 8/2004 Letts et al. ................. 702/117

* cited by examiner

*Primary Examiner*—Hal Wachsman
(74) *Attorney, Agent, or Firm*—Moser, Patterson, Sheridan LLP; Thomas F. Lenihan

(57) ABSTRACT

Methods for displaying an anomaly in a periodic waveform. Specifically, in one embodiment according to the present invention, a method is provided of (a) setting a pulse start address, (b) setting an initial screen position, (c) displaying a pulse at a time-aligned position, (d) updating the pulse start address in response to a pulse width value, (e) repeating (c) and (d), and (f) interactively adjusting the pulse width value at any time without using a clock recovery procedure.

20 Claims, 4 Drawing Sheets

METHODS FOR DISPLAYING JITTER AND OTHER ANOMALIES IN LONG ACQUISITION DATA RECORDS

CLAIM OF PRIORITY

This application claims priority from U.S. Provisional Patent Application No. 60/428,493, filed Nov. 22, 2002 and entitled "Method for Displaying Jitter and Other Anomalies in Long Acquisition Data Records," which is incorporated herein by reference for all purposes.

FIELD OF THE INVENTION

The invention relates generally to waveform analysis and, more particularly, methods for displaying jitter and other anomalies in long acquisition data records of signals under test (SUTs).

BACKGROUND OF THE INVENTION

As tighter timing margins and rapidly ascending clock rates drive today's high-speed designs, timing jitter (hereafter referred to simply as "jitter") is becoming a more significant cause of system errors. Jitter can significantly reduce margin in an otherwise sound design. For example, excessive jitter can increase the bit error rate (BER) of a communications signal by incorrectly transmitting a data bit stream. In digital systems, jitter can violate timing margins, causing circuits to behave improperly. As a consequence, examining jitter and other anomalies is desired to determine the robustness of a system and how close it is to failing.

Recent trends to more rapidly changing signals have led to faster sampling speeds and larger memories with corresponding problems in displaying the data. A number of methods have been developed for displaying jitter and other anomalies in data streams. Signal acquisition devices such as digital storage oscilloscopes (DSOs) can be used to facilitate real time jitter analysis of an SUT. Some prior art attempts take a waveform from a DSO and process the waveform on a personal computer (PC). Other prior art attempts require a user to scroll back and forth along a long acquisition data record. Further, some prior art attempts require computations that are slow and do not identify outliers in the distribution of pulses.

SUMMARY OF INVENTION

These and other deficiencies of the prior art are addressed by the present invention of a method of displaying an anomaly in a periodic waveform. Specifically, in one embodiment according to the present invention, a method is provided of (a) setting a pulse start address, (b) setting an initial screen position, (c) displaying a pulse at a time-aligned position, (d) updating the pulse start address in response to a pulse width value, (e) repeating (c) and (d), and (f) interactively adjusting the pulse width value at any time without using a clock recovery procedure.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of a measurement apparatus such as a DSO. However, it will be appreciated by those skilled in the art that the invention may be advantageously employed in any signal measurement or analysis device in which one or a plurality of SUTs may be processed to derive the timing parameters of a plurality of contiguous events.

As mentioned herein, displaying jitter and other anomalies is often very useful. Some prior art attempts take a waveform from a DSO and process the waveform on a personal computer (PC). Other prior art attempts require a user to scroll back and forth along a long acquisition data record. However, it would be desirable to eliminate the need for scrolling and enable a user to visually detect jitter and other anomalies in a long acquisition data record.

Figure 1:
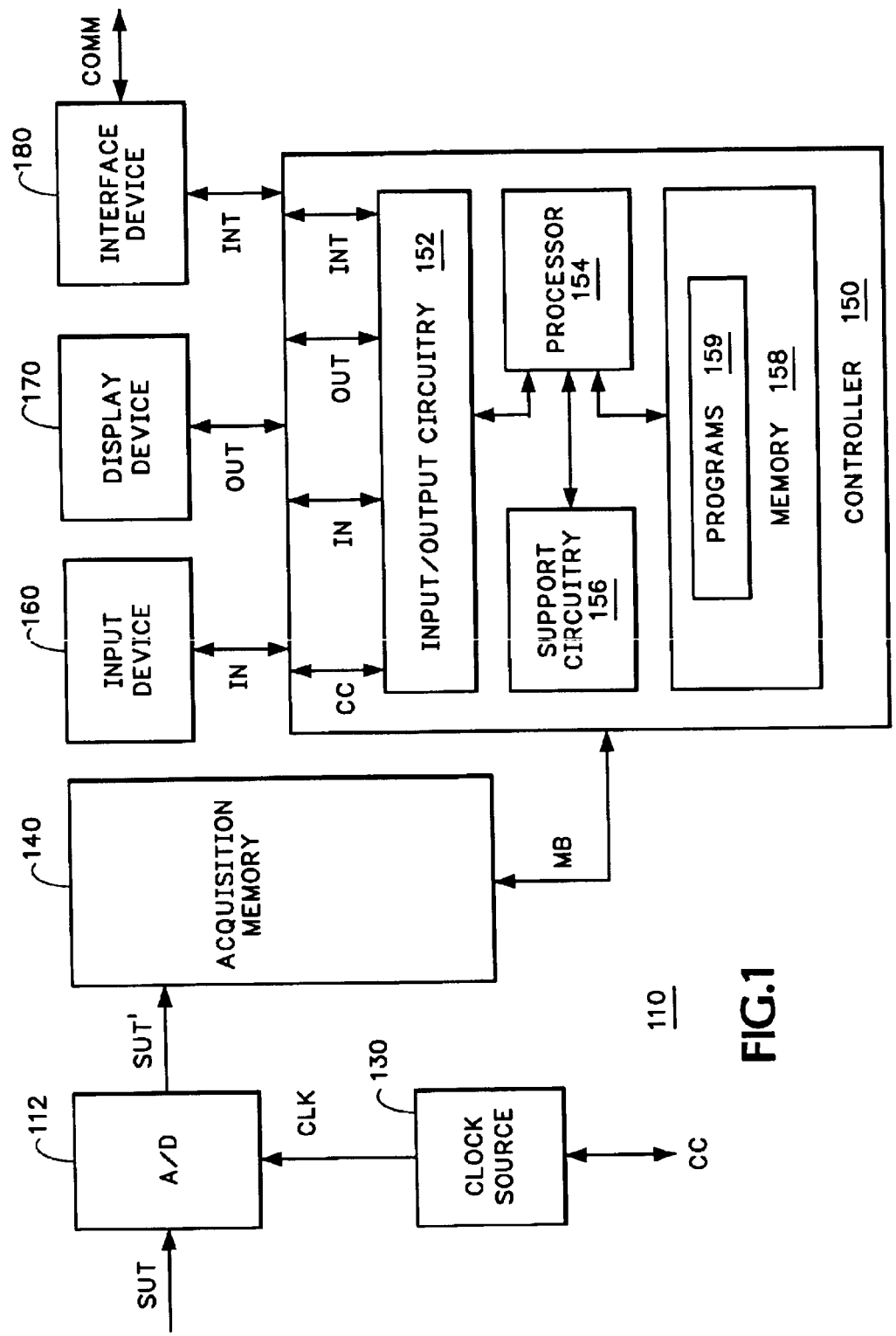
FIG. 1 depicts a high level block diagram of a signal analysis system.

FIG. 1 depicts a high level block diagram of a signal analysis device. Specifically, the system (signal analysis device) 110 of FIG. 1 comprises an analog to digital (A/D) converter 112, a clock source 130, an acquisition memory 140, a controller 150, an input device 160, a display device 170 and an interface device 180.

The A/D converter 112 receives and digitizes an SUT in response to a clock signal CLK produced by the clock source 130. The clock signal CLK is preferably a clock signal adapted to cause the A/D converter 112 to operate at a maximum sampling rate, though other sampling rates may be selected. The clock source 130 is optionally responsive to a clock control signal CC produced by the controller 150 to change frequency and/or pulse width parameters associated with the clock signal CLK.

A digitized output signal SUT' produced by the A/D converter 112 is stored in the acquisition memory 140. The acquisition memory 140 cooperates with the controller 150 to store the data samples provided by the A/D converter 110 in a controlled manner such that the samples from the A/D converter 110 may be provided to the controller 150 for further processing and/or analysis.

The controller 150 is used to manage the various operations of the system 110. The controller 150 performs various processing and analysis operations on the data samples stored within the acquisition memory 140. The controller 150 receives user commands via an input device 160, illustratively a keypad or pointing device. The controller 150 provides image-related data to a display device 170, illustratively a cathode ray tube (CRT), liquid crystal display (LCD) or other display device. The controller 150 optionally communicates with a communications link COMM, such as a general purpose interface bus (GPIB), Internet protocol (IP), Ethernet or other communications link via the interface device 180. It is noted that the interface device 180 is selected according to the particular communications network used. An embodiment of the controller 150 will be described in more detail below.

The system 110 of FIG. 1 is depicted as receiving only one SUT. However, it will be appreciated by those skilled in the art that many SUTs may be received and processed by the system 110. Each SUT is preferably processed using a respective A/D converter 112, which respective A/D converter may be clocked using the clock signal CLK provided by a common or respective clock source 130 or some other clock source. Each of the additional digitized SUTs is coupled to the acquisition memory 140 or additional acquisition memory (not shown). Any additional acquisition memory communicates with the controller 150, either directly or indirectly through an additional processing element.

The controller 150 comprises a processor 154 as well as memory 158 for storing various control programs 159. The processor 154 cooperates with conventional support circuitry 156 such as power supplies, clock circuits, cache memory and the like, as well as circuits that assist in executing the software routines stored in the memory 158. As such, it is contemplated that some of the process steps discussed herein as software processes may be implemented within hardware, for example as circuitry that cooperates with the processor 154 to perform various steps. The controller 150 also contains input/output (I/O) circuitry 152 that forms an interface between the various functional elements communicating with the controller 150. For example, in the embodiment of FIG. 1, the controller 150 optionally communicates with the clock source 130 (via clock control signal CC). The controller 150 also communicates with the input device 160 via a signal path IN, a display device 170 via a signal path OUT and the interface device 180 via a signal path INT and the acquisition memory 140 via signal path MB. The controller 150 may also communicate with additional functional elements (not shown), such as those described herein as relating to additional channels, SUT processing circuitry, switches, decimators and the like. It is noted that the memory 158 of the controller 150 may be included within the acquisition memory 140, that the acquisition memory 140 may be included within the memory 158 of the controller 150, or that a shared memory arrangement may be provided.

Although the controller 150 is depicted as a general purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware or a combination thereof.

Figure 2:
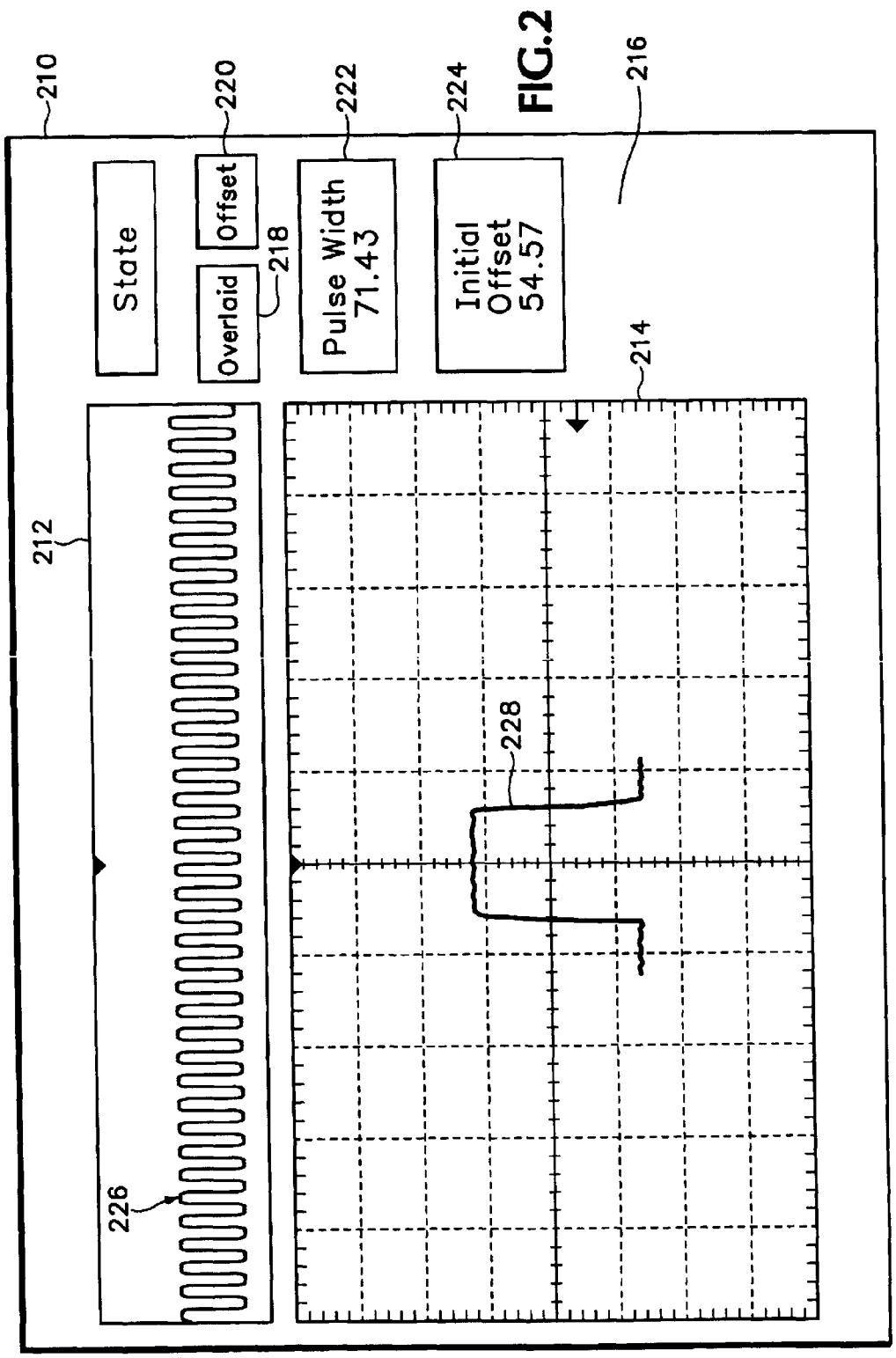
FIG. 2 depicts a DSO screen with a waveform on the top and overlaid pulses on the bottom.

FIG. 2 depicts a DSO screen 210. In one embodiment, the screen 210 comprises a first display area 212, a second display area 214 and a third display area 216. The screen 210 also comprises a state overlaid control button 218 and a state offset control button 220. The screen 210 further comprises a fractional pulse width control button 222 and an initial offset control button 224.

The first display area 212 shows a waveform 226 that is a simulation of a long record of an SUT. In one embodiment, 10,000 sample points representing voltage values or the like are displayed at regular intervals. It is contemplated that the system 110 can display more or fewer sample points.

The second display area 214 shows a group of overlaid pulses 228. The system 110 has divided waveform 226 into individual pulses and overlaid the individual pulses on top of each other to form the group of overlaid pulses 228. If there is a problem with one or more pulses, or a slowly modulating change, then a user can visually detect fuzzy edges, spikes or the like on the group of overlaid pulses 228.

The third display area 216 shows the state overlaid control button 218 and the state offset control button 220. If the user selects the state overlaid control button 218 (via a mouse or the like, for example) the second display area 214 displays the group of overlaid pulses 228 as in FIG. 2. However, if the user selects the state offset control button 220 the second display area 214 displays the pulses of the waveform 226 in an offset fashion, as described with reference to FIG. 3.

Still referring to FIG. 2, the fractional pulse width control button 222 is shown in the third display area 216. Pulses typically are not an integer number of sample points wide. The fractional pulse width control button 222 allows the user to adjust the pulse width (i.e., adjust how the waveform 226 is divided up into individual pulses). In one embodiment, the pulse width is 71 sample points plus 0.43 of a sample point wide, as indicated in FIG. 2. The user can select the fractional pulse width control button 222 and change the value of 71.43 to another value (with a general purpose knob, for example). If the user modifies this value, the group of overlaid pulses 228 (currently appearing to be a single pulse) will possibly become fuzzy. The user can compute an approximate (or exact) average pulse width interactively by adjusting this value until the group of overlaid pulses 228 appears to be a single pulse with little or no fuzziness.

Additionally, fuzziness around the edges of the group of overlaid pulses 228 can indicate jitter. Fuzziness at the top of the group of overlaid pulses can indicate a varying amplitude. Other anomalies can be indicated by the presence of a spike or the like on the group of overlaid pulses 228, or by a plurality of shapes at the top of the group of overlaid pulses 228.

The third display area 216 further includes the initial offset control button 224. In one embodiment, the initial offset is 54.57. If the user selects the initial offset control button 224 (via a mouse or the like, for example) then the user is able to adjust (with a general purpose knob, for example) the starting point at which the first pulse begins when the system 110 divides the waveform 226 into discrete pulses. For example, the user may want to adjust the initial offset so the pulses are concave up instead of concave down.

Figure 3:
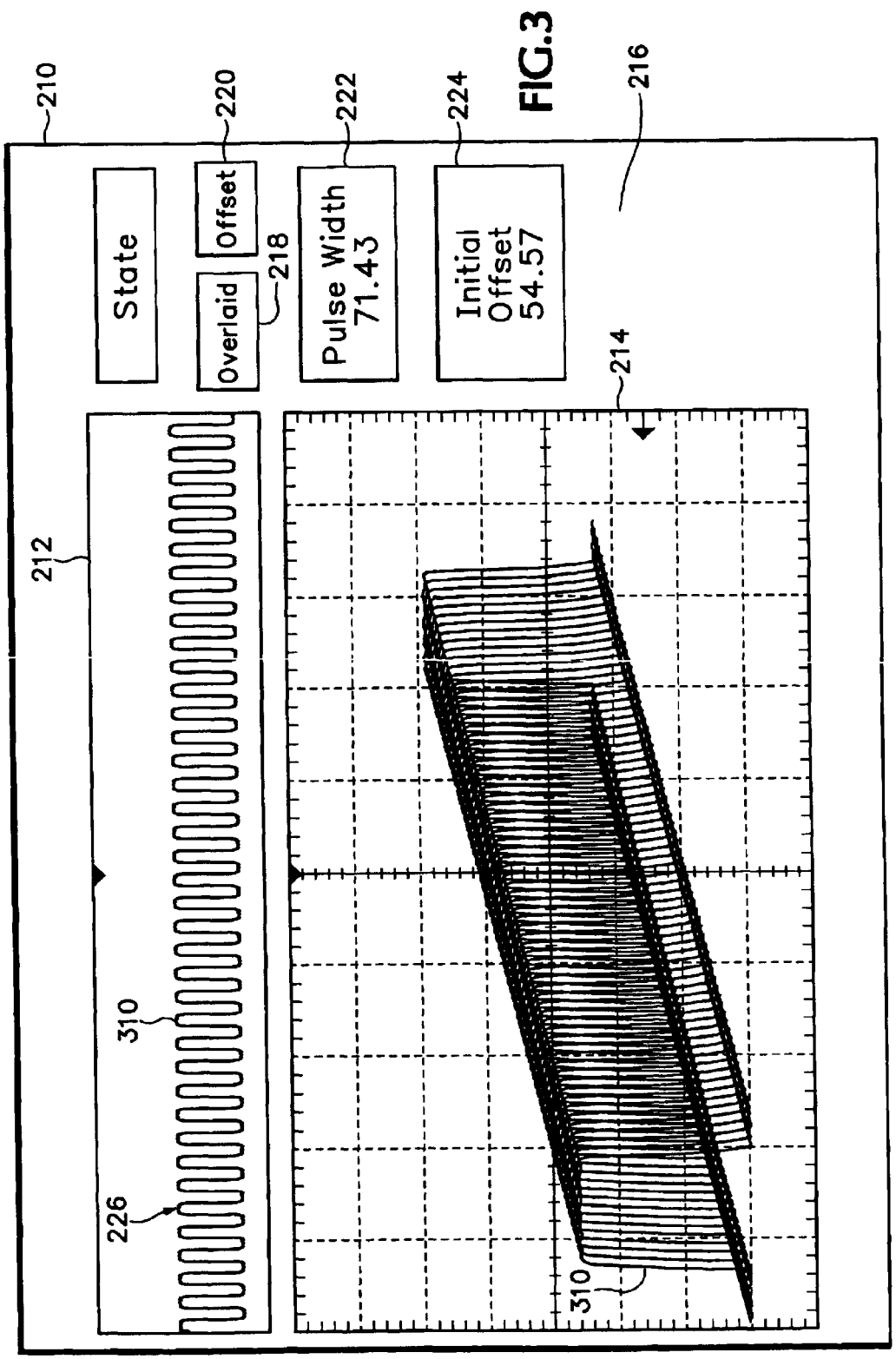
FIG. 3 depicts a DSO screen with a waveform on the top and a plurality of offset pulses on the bottom.

FIG. 3 depicts the DSO screen 210 in another mode. In one embodiment, the screen 210 still comprises the first display area 212, the second display area 214 and the third display area 216. The screen 210 also comprises the state overlaid control button 218 and the state offset control button 220. The screen 210 further comprises the fractional pulse width control button 222 and the initial offset control button 224. In FIG. 3, the user has selected the state offset control button 220.

The second display area 214 displays the pulses 310 of the waveform 226 in an offset fashion as mentioned herein. If there is an anomaly in the train of pulses 310 then the user can quickly visually determine that an anomaly or anomalies occurred and where in the record the anomaly occurred. It is noteworthy that the train of pulses 310 has a smooth shape. However, if there were an anomaly or anomalies then there would be one or more bumps, discontinuities or the like in the train of pulses 310. As used herein, the term "anomaly" refers to jitter, a glitch, an unexpected change in shape, a bump, a discontinuity, other anomalies or the like.

This system 110 allows for continuous updating of waveforms and is ideal for continuous visual monitoring of infrequent events. Prior art attempts, in contrast, include software packages that take a single waveform out of a DSO into a PC and analyze the waveform one pulse at a time.

In one embodiment, the system 110 utilizes a high speed rasterizer in an ASIC that draws the waveforms very quickly.

The rasterizer allows the system 110 to simulate effects of a digital phosphor oscilloscope (DPO).

It is envisioned that instead of control buttons, pull-down menus or the like, any other suitable means can be used in conjunction with embodiments according to the present invention.

Figure 4:
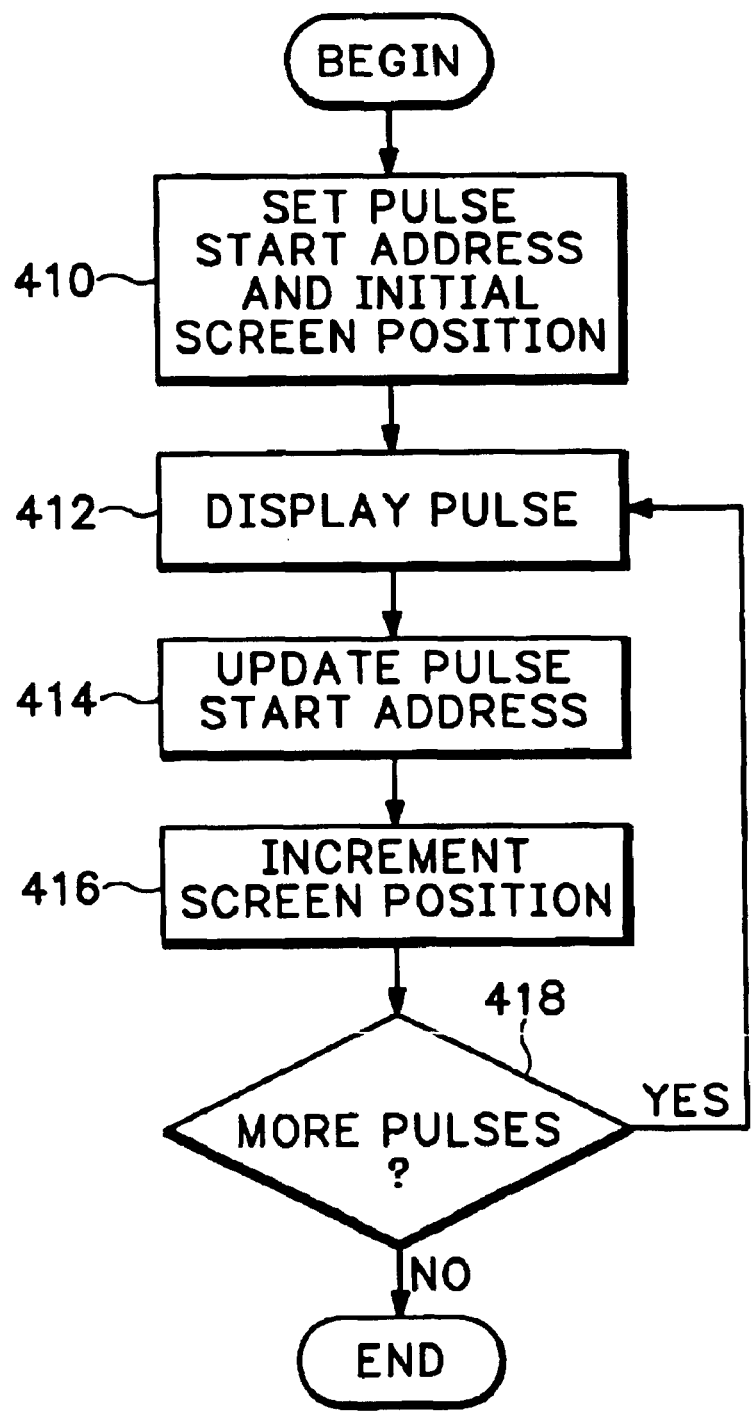
FIG. 4 is a flow diagram of a method performed according to an embodiment of the present invention.

FIG. 4 is a flow diagram of a method performed according to an embodiment of the present invention. This exemplary methodology can be used to facilitate the output shown in the second display area 214 of FIG. 3.

At step 410, the system 110 has stored a long record (e.g., 10 million points) in the memory 158. The system 110 sets the pulse start address and initial screen position. In other words, the system 110 starts a pointer at the beginning of the record and starts drawing the first pulse 310 at this point in the second display area 214 of the screen 210.

At step 412, the system 110 draws a pulse at a time-aligned position (in this case, typically an offset position which is the current screen location in the second display area 214 of the screen 210). A rasterizer can be used to draw the pulse, as mentioned herein.

At step 414, the system 110 updates the pulse start address by adding the pulse width (or another appropriate value) to the pulse start address. The system 110 moves the pointer to the memory location for the beginning of the next pulse.

At step 416, the system 110 increments (or modifies) the screen position so that the next pulse is drawn in a slightly different location than the previous pulse (e.g., up and to the right slightly). This offsetting technique facilitates rapid visual identification of anomalies, as mentioned herein.

At step 418, the system 110 determines if there are any more pulses to draw. If there are more pulses to draw, the process proceeds to step 412.

At any time a user can interactively adjust the pulse width value without using a clock recovery procedure. Prior art systems would assume a waveform had a specific repetition rate and use an algorithm to calculate a clock rate and/or pulse width.

A similar methodology can be used in connection with drawing the group of overlaid pulses 228 of FIG. 2. However, in this case the system 110 will not modify the screen position such that each subsequent pulse is displaced from the previous pulse. Instead, the system 110 draws the pulses over each other at a time time-aligned position.

In one embodiment, the system 110 computes an initial screen position as (d−p)/2, where d is the number of display columns and p is the pulse width expressed in terms of display columns. The system 110 adds the (fractional) initial offset (or another appropriate corresponding value) to the pulse start address of the acquired record, sets the number of points to display equal to the pulse width expressed in terms of display columns, and requests the rasterizer to display the pulse. When a pulse is complete, the control software adds the pulse width (or another appropriate corresponding value) to the pulse start address and requests the rasterizer to display the pulse, until all pulses have been drawn. In one embodiment, the system 110 highlights individual pulses that differ substantially from the norm.

In one embodiment, each of the alternate display modes (single overlaid pulses and offset pulses) described herein can also be combined with jitter measurements that are derived from trigger level crossing points in long records. If hardware accelerators are used to extract crossing points in parallel with acquisition and/or rasterization (using two or three data buffers, for example), such pulse width measurements as mean, standard deviation, minimum and maximum could be computed for every acquisition. They can then be displayed as numeric values and as graphic indicators overlaid on the pulse display.

Therefore, an improved waveform analysis methodology and system has been shown and described. Real-time acquisition and display of a periodic waveform is contemplated in one embodiment. Embodiments according to the present invention provide virtually instantaneous feedback to a user without requiring the waveform to be taken from the oscilloscope and fed to a software analysis package. Time consuming analysis setup steps thus are not required.

The invention has been primarily described within the context of methods for displaying jitter and other anomalies in long acquisition data records of an SUT. It will be appreciated by those skilled in the art and informed by the teachings of the present invention that devices other than a DSO can be used in conjunction with the present invention. It is noteworthy that the pulses are not necessarily drawn to scale.

While the foregoing is directed to the preferred embodiment of the present invention, other and further embodiments of the invention may be devised without departing from the basic scope thereof, and the scope thereof is determined by the claims that follow.

What is claimed is:

1. A method of displaying a periodic waveform, said periodic waveform including a plurality of pulses, and being subject to including an anomaly, said method comprising:
   (a) setting a pulse start address;
   (b) setting an initial screen position;
   (c) displaying a pulse of said plurality of pulses at a time-aligned position;
   (d) updating said pulse start address in response to a pulse width value;
   (e) repeating (c) and (d); and
   (f) interactively adjusting said pulse width value at any time without using a clock recovery procedure;
   said anomaly being displayed with said pulse when said anomaly is present.

2. The method of claim 1, further comprising incrementing a screen position when (c) and (d) are repeated.

3. The method of claim 2, wherein displaying a pulse at a time-aligned position comprises offsetting the pulse.

4. The method of claim 1, wherein a fractional initial offset is added to said pulse start address.

5. The method of claim 1, wherein a pulse width is added to said pulse start address.

6. The method of claim 1, wherein setting said initial screen position includes utilizing a formula (d−p)/2, where d is a number of display columns and p is a pulse width.

7. The method of claim 1, wherein a rasterizer is implemented to draw a pulse.

8. The method of claim 1, wherein pulses are drawn over each other.

9. A test and measurement device, comprising:
   an acquisition module, for acquiring a first signal under test (SUT) to produce there from a first sample stream, said signal under test including a plurality of pulses and being subject to including an anomaly;
   a processing module, for
      (a) setting a pulse start address,
      (b) setting an initial screen position,
      (c) displaying a pulse of said plurality of pulses at a time-aligned position, (d) updating said pulse start address in response to a pulse width value, (e) repeating (c) and (d), and (f) interactively adjusting said pulse width value at any time without using a clock recovery procedure; and a display module, for displaying said pulse;

said anomaly being displayed with said pulse when said anomaly is present.

10. The test and measurement device of claim 9, wherein said time-aligned position is a display position of a last displayed pulse offset by predetermined amounts in X and Y axes.

11. The test and measurement device of claim 9, wherein said processing module is further for adding a fractional initial offset to said pulse start address.

12. The test and measurement device of claim 9, wherein said processing module is further for adding a pulse width expressed in terms of display columns to said pulse start address.

13. The test and measurement device of claim 9, wherein said processing module is further for setting said initial screen position utilizing a formula (d−p)/2, where d is a number of display columns and p is a pulse width.

14. The test and measurement device of claim 9, wherein said processing module is further for implementing a rasterizer to draw a pulse.

15. The test and measurement device of claim 9, wherein said processing module is further for drawing pulses over each other.

16. A computer-readable media for storing software instructions which when executed by a processor perform the steps of:

displaying a periodic waveform including a plurality of pulses, by (a) setting a pulse start address;

(b) setting an initial screen position;

(c) displaying a pulse of said plurality of pulses at a time-aligned position;

(d) updating said pulse start address in response to a pulse width value;

(e) repeating (c) and (d); and (f) interactively adjusting said pulse width value at any time without using a clock recovery procedure;

wherein said periodic waveform is subject to including an anomaly, which anomaly is displayed with said pulse when said anomaly is present.

17. The computer-readable media of claim 16, further comprising instructions for incrementing a screen position when (c) and (d) are repeated.

18. The computer-readable media of claim 17, further comprising instructions for offsetting pulses.

19. The computer-readable media of claim 16, further comprising instructions for adding a fractional initial offset to said pulse start address.

20. The computer-readable media of claim 16, further comprising instructions for adding a pulse width to said pulse start address.

* * * * *